United States Patent
Jeon et al.

(10) Patent No.: US 9,231,057 B2
(45) Date of Patent: Jan. 5, 2016

(54) POWER SWITCHING DEVICE AND METHOD OF MANUFACTURING THE SAME

(71) Applicant: Samsung Electronics Co., Ltd., Suwon-Si, Gyeonggi-Do (KR)

(72) Inventors: Woo-chul Jeon, Daegu (KR); Young-hwan Park, Seoul (KR); Ki-yeol Park, Suwon-si (KR); Jai-kwang Shin, Anyang-si (KR); Jae-joon Oh, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 13/927,230

(22) Filed: Jun. 26, 2013

(65) Prior Publication Data

US 2014/0091312 A1 Apr. 3, 2014

(30) Foreign Application Priority Data

Sep. 28, 2012 (KR) ........................ 10-2012-0109266

(51) Int. Cl.

| H01L 29/15 | (2006.01) |
| H01L 21/332 | (2006.01) |
| H01L 29/20 | (2006.01) |
| H01L 29/66 | (2006.01) |
| H01L 29/861 | (2006.01) |
| H01L 29/205 | (2006.01) |

(52) U.S. Cl.
CPC ...... *H01L 29/2003* (2013.01); *H01L 29/66204* (2013.01); *H01L 29/66325* (2013.01); *H01L 29/861* (2013.01); *H01L 29/205* (2013.01)

(58) Field of Classification Search
CPC ............. H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
USPC .......... 257/194, 76, 183, 140, 355, 134, 192, 257/330; 438/135, 574, 238, 704
See application file for complete search history.

(56) References Cited

U.S. PATENT DOCUMENTS

| 2005/0194612 | A1 | 9/2005 | Beach |
| 2007/0210335 | A1* | 9/2007 | Ikeda et al. ................ 257/201 |
| 2010/0044753 | A1* | 2/2010 | Sugimoto et al. ........... 257/192 |
| 2011/0042718 | A1 | 2/2011 | Wang et al. |
| 2011/0049572 | A1* | 3/2011 | Jeon et al. .................. 257/201 |

(Continued)

FOREIGN PATENT DOCUMENTS

| JP | 2007184313 A | 7/2007 |
| JP | 2009283807 A | 12/2009 |

(Continued)

*Primary Examiner* — Robert Bachner
*Assistant Examiner* — Moin Rahman
(74) *Attorney, Agent, or Firm* — Harness, Dickey & Pierce, P.L.C.

(57) ABSTRACT

A power switching device includes a channel forming layer on a substrate which includes a 2-dimensional electron gas (2DEG), and a channel supply layer which corresponds to the 2DEG at the channel forming layer. A cathode is coupled to a first end of the channel supply layer and an anode is coupled to a second end of the channel supply layer. The channel forming layer further includes a plurality of depletion areas arranged in a pattern, and portions of the channel forming layer between the plurality of depletion areas are non-depletion areas.

11 Claims, 8 Drawing Sheets

(56) References Cited

U.S. PATENT DOCUMENTS

| | | | |
|---|---|---|---|
| 2011/0068371 A1* | 3/2011 | Oka | 257/194 |
| 2011/0210337 A1* | 9/2011 | Briere | 257/76 |
| 2011/0244610 A1 | 10/2011 | Saito et al. | |
| 2011/0272742 A1* | 11/2011 | Akiyama et al. | 257/194 |
| 2012/0112202 A1* | 5/2012 | Hwang et al. | 257/76 |
| 2012/0146051 A1* | 6/2012 | Park et al. | 257/77 |

FOREIGN PATENT DOCUMENTS

| | | |
|---|---|---|
| KR | 20070042766 A | 4/2007 |
| KR | 20090103472 A | 10/2009 |
| KR | 20100024980 A | 3/2010 |
| KR | 20110009709 A | 1/2011 |
| KR | 20110022453 A | 3/2011 |
| KR | 20110107618 A | 10/2011 |

* cited by examiner

POWER SWITCHING DEVICE AND METHOD OF MANUFACTURING THE SAME

CROSS-REFERENCE TO RELATED APPLICATIONS

This application claims the benefit of Korean Patent Application No. 10-2012-00109266, filed on Sep. 28, 2012, in the Korean Intellectual Property Office, the disclosure of which is incorporated herein in its entirety by reference.

BACKGROUND

1. Field

The present disclosure relates to semiconductor devices.

2. Description of the Related Art

A power switching system for driving various types of motors; may require switching an AC current to a DC current, a DC current to an AC current, and one type of DC current to another type of DC current. In these devices, the flow of current may be controlled by using an ON/OFF switching device. Such a device may correspond to a power semiconductor such as a power MOSFET, an insulated gate bipolar transistor (IGBT), a bipolar junction transistor (BJT), or a Schottky barrier diode (SBD).

In a power switching system that implements power factor correction (PFC), the overall efficiency of the power switching system may depend on efficiency of a power switching device (including a diode). Currently used power switching devices are silicon-based diodes. However, due to material limits of silicon, the ability to improve the efficiency of the power switching device is limited.

Recently, research for improving power switching efficiency has focused on fabricating a Schottky barrier diode using a gallium nitride (GaN) semiconductor. However, due to a wide band gap, a GaN semiconductor has strengths in terms of reverse leakage current and withstanding voltage, but also has high forward turn-on voltage which may prove to be a drawback for some applications.

SUMMARY

In accordance with one embodiment, power switching device is provided to have lower forward turn-on voltage and reduced reverse leakage current.

In accordance with another embodiment, a method of manufacturing the aforementioned type of power switching device is provided.

According to one embodiment, a power switching device includes a substrate; a channel forming layer, which is formed on the substrate and includes a 2-dimensional electron gas (2DEG); a channel supply layer, which forms the 2DEG at the channel forming layer; a cathode contacting a first end of the channel supply layer; and an anode contacting a second end of the channel supply layer, wherein the channel forming layer includes a plurality of depletion areas arranged in a stripe pattern, and portions of the channel forming layer between the plurality of depletion areas are non-depletion areas.

A plurality of P-GaN layers exist on the channel supply layer, and the plurality of P-GaN layers correspond to the plurality of depletion areas, respectively. A plurality of recesses exist in the channel supply layer, and the plurality of recesses correspond to the plurality of depletion areas, respectively. A plurality of holes by which the plurality of depletion areas are exposed are formed in the channel supply layer, and the plurality of holes correspond to the plurality of depletion areas, respectively.

The anode contacts the P-GaN layers and covers at least portions of the P-GaN layers. The anode overlaps the P-GaN layers at least partially, the P-GaN layers are covered by an insulation layer, and the anode is arranged on the insulation layer.

The recesses are covered by an insulation layer, and the anode is arranged on the insulation layer. The inner surfaces of the holes and the portions exposed by the holes are covered by an insulation layer, and the anode is arranged on the insulation layer.

The recesses are arranged at an end of the channel supply layer close to the anode. The cathode and the anode are arranged on the channel forming layer and contact the channel supply layer. The cathode and the anode are arranged on the channel supply layer.

According to another embodiment, a method of manufacturing a power switching device, the method includes forming a channel forming layer, which includes a 2-dimensional electron gas (2DEG), on a substrate; forming a channel supply layer, which forms the 2DEG at the channel forming layer, on the channel forming layer; forming a plurality of depletion areas, which are arranged in a stripe pattern, at the channel forming layer; and forming a cathode and an anode contacting a first end and a second end of the channel supply layer, respectively, wherein portions of the channel forming layer between the plurality of depletion areas are non-depletion areas.

The forming of the plurality of depletion areas includes forming a plurality of P-GaN layers on the channel supply layer, and the plurality of P-GaN layers are formed to correspond to the plurality of depletion areas, respectively.

The forming of the plurality of depletion areas includes forming a plurality of recesses in the channel supply layer, and the plurality of recesses are formed to correspond to the plurality of depletion areas, respectively.

The forming of the plurality of depletion areas includes forming a plurality of holes, by which the plurality of depletion areas are exposed, in the channel supply layer, and the plurality of holes are formed to correspond to the plurality of depletion areas, respectively.

An insulation layer is formed to cover the plurality of P-GaN layers. An insulation layer is formed to cover the recesses, and the anode is formed to cover the recesses. An insulation layer is formed on the channel supply layer to cover the inner surfaces of the plurality of holes and depletion areas exposed by the holes, and the anode cover the holes. The cathode and the anode are formed on the channel forming layer. The cathode and the anode are formed on the channel supply layer.

According to another embodiment, a semiconductor device comprises a first semiconductor layer over a substrate, a second semiconductor layer over the first layer, a two-dimensional electron gas adjacent an interface between the first and second semiconductor layers, and a formation corresponding to the second semiconductor layer. The first semiconductor layer includes a first area aligned with the formation and a second area adjacent the first area. The first area further corresponds to a depletion region and the second area corresponds to a non-depletion area. A density of the two-dimensional electron gas at a first level in the first area and at a second level greater than the first level in the second area.

The semiconductor device further includes a first electrode coupled the first and second semiconductor layers; and a second electrode coupled to the first and second semiconductor layers at a location different from the first electrode. The second semiconductor layer may be between the first and second electrodes. Also, the first level may be substantially zero.

The formation may include at least one semiconductor section over the second semiconductor layer, and the at least one semiconductor section may include GaN doped with a p-type impurity.

The formation may include a plurality of spaced semiconductor sections over the second semiconductor layer. The first semiconductor layer may include a plurality of first areas corresponding to respective ones of the semiconductor sections and a plurality of second areas corresponding to areas between the semiconductor sections. The first areas may correspond to depletion regions and the second areas corresponding to non-depletion regions.

The formation may include at least one recess in the first semiconductor layer. The first semiconductor layer may have a first thickness in the first area corresponding to the at least one recess and a second thickness greater than the first thickness corresponding to the second area.

The semiconductor device may further include an insulation layer over the second semiconductor layer and the formation. Also, the first and second areas may have different widths, and the second area may change into a depletion region when a voltage is applied.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
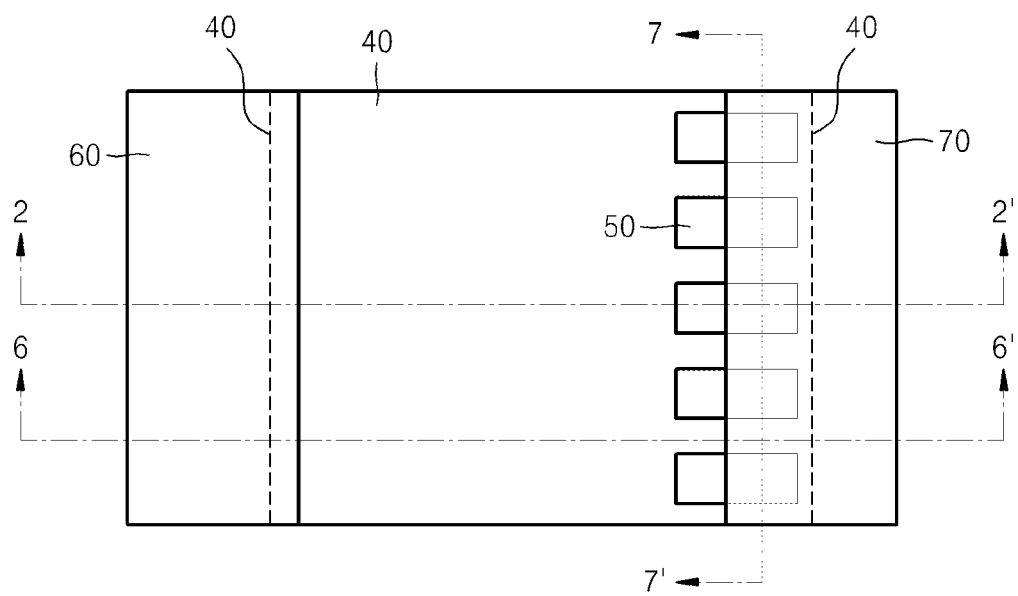
FIG. 1 is a plan view of an embodiment of a power switching device.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements in the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

In the drawings, it is understood that the thicknesses of layers and regions may be exaggerated for clarity. It will also be understood that when a layer is referred to as being "on" another layer or substrate, it can be directly on the other layer or substrate or intervening layers may also be present. Like reference numerals in the drawings denote like elements, and thus their description will not be repeated. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Embodiments of a power switching device and a method of manufacturing the same are described below with reference to the attached drawings. In the drawings, the thicknesses of layers and regions may be exaggerated for clarity.

In accordance with one embodiment, a forward driving voltage of a common diode may be around 1.5V, whereas a Schottky barrier diode having an AlGaN/GaN HEMT structure may have a relatively high turn-on voltage around 1.5V.

In other embodiments, the driving voltages may be different. For example, a power switching device may have a lower turn-on voltage, for example, below or equal to 1V, and may be driven with a rated current at 1.5V.

FIG. 1 shows a power switching device according to an embodiment which includes a cathode 60 and an anode 70. The cathode 60 and the anode 70 are separated from each other by a desired distance, and a channel supply layer 40 is arranged between the cathode 60 and the anode 70. The channel supply layer 40 and the cathode 60 may partially overlap each other in this embodiment, and the channel supply layer 40 and the anode 70 may also partially overlap each other.

The power switching device may also include a plurality of semiconductor layers 50 in the channel supply layer 40. In accordance with one embodiment, semiconductor layers 50 are made from a Group-III nitride family of semiconductors doped with a certain impurity. The semiconductor layers 50 may be made from the same type of material or different materials. In the illustrative embodiment of FIG. 1, semiconductor layers 50 are made of GaN material doped with a P-type material. For the sake of illustration, semiconductor layers 50 will be referred to as P-GaN layers in the following discussion.

The plurality of P-GaN layers 50 are separated from one another and may be arranged in a desired pattern including but not limited to a stripe pattern. The spacing between layers 50 may be the same or different. Also, the P-GaN layers 50 may serve to reduce or eliminate the density of a 2-dimensional electron gas (2DEG) therebelow. Therefore, in one embodiment, the P-GaN layers 50 may correspond to a depletion area in the power switching device. As shown, the plurality of P-GaN layers 50 may partially overlap with the anode 70.

Figure 2:
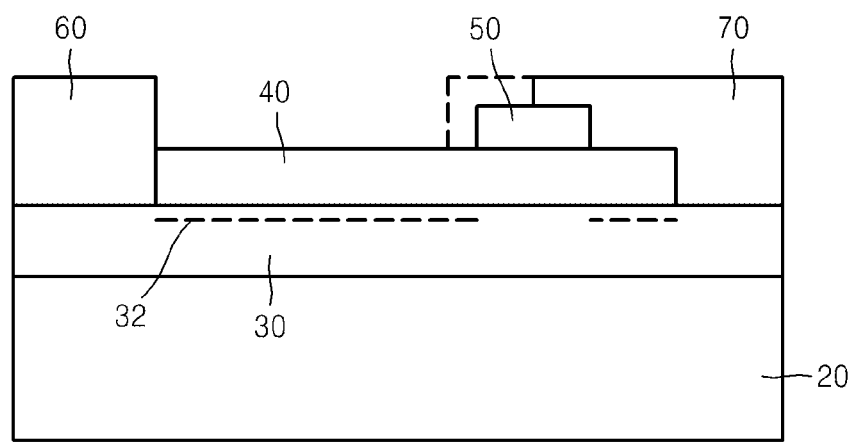
FIG. 2 is a sectional view, taken along a line 2-2' of FIG. 1.

FIG. 2 is a sectional view, taken along a line 2-2' of FIG. 1. Referring to FIG. 2, a channel forming layer 30, in which a channel is formed, is formed on a substrate 20. The channel forming layer 30 may be a Group III-V compound semiconductor layer, for example. However, the channel forming layer 30 may be made from different compounds in other embodiments. The Group III-V compound semiconductor layer may be a GaN layer, for example.

Also, the channel forming layer 30 may contain a 2DEG 32 used as a channel carrier. The 2DEG may be distributed below the top surface of the channel forming layer 30. The channel supply layer 40 is arranged on an area of the top surface of the channel forming layer 30. The channel supply layer 40 is a layer for forming a channel, that is, the 2DEG 32 in the channel forming layer 30. Therefore, the component denoted by the reference numeral 40 will be referred to as the channel supply layer.

The channel supply layer 40 may be a compound semiconductor layer having a different polarizability or a different band gap from that of the channel forming layer 30. The polarizability and band gap of the channel supply layer 40 may be greater than those of the channel forming layer 30. Due to a difference between band gaps of the channel supply layer 40 and the channel forming layer 30, the 2DEG 32 may be formed in the channel forming layer 30. The channel supply layer 40 may be an AlGaN layer, for example.

In FIG. 2, the cathode 60 may be arranged on the left side of the channel supply layer 40, whereas the anode 70 may be arranged on the right side of the channel supply layer 40. The cathode 60 is formed on the channel forming layer 30 and may be coupled to the channel supply layer 40 (e.g., in one embodiment the cathode 60 may contact the channel supply layer 40). A portion of the cathode 60 may be located on the channel supply layer 40. In other words, the cathode 60 may partially overlap the channel supply layer 40. The anode 70 may be located to face the cathode 60 and may be arranged on the channel forming layer 30. Also, the anode 70 may be coupled to the channel supply layer 40 (e.g., in one embodiment, the anode 70 may contact the channel supply layer 40). A portion of the anode 70 may overlap with the channel supply layer 40.

The P-GaN layers 50 doped with a p-type impurity are arranged on a portion of the channel supply layer 40. Due to the P-GaN layers 50, a density of the portion of the 2DEG 32 right below the P-GaN layers 50 may be significantly lower than a density of a remaining portion of the 2DEG 32 or the portion of the 2DEG 32 right below the P-GaN layers 50 may be eliminated. Therefore, a portion of the channel forming layer 30 right below the P-GaN layers 50 may become a depletion area. In one embodiment, the P-GaN layers 50 are closer to the anode 70 than to the cathode 60. At least a portion of the P-GaN layers 50 may overlap the anode 70. As indicated by using a broken line, in one embodiment the anode 70 may expand to completely cover the P-GaN layers 50.

The switching device shown in FIG. 2 may be, for example, a power diode. Also, in alternative embodiments, the cathode 60 and the anode 70 may not contact the channel forming layer 30 and may be arranged on the channel supply layer 40.

Figure 3:
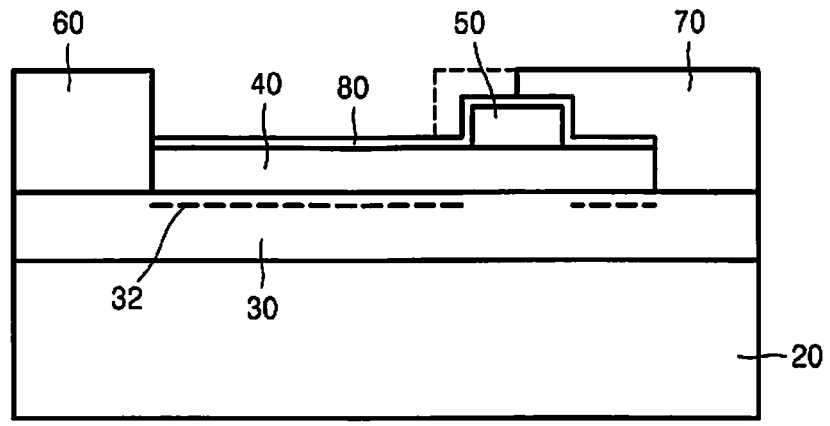
FIGS. 3 through 5 show an embodiment of switching device.
Figure 4A:
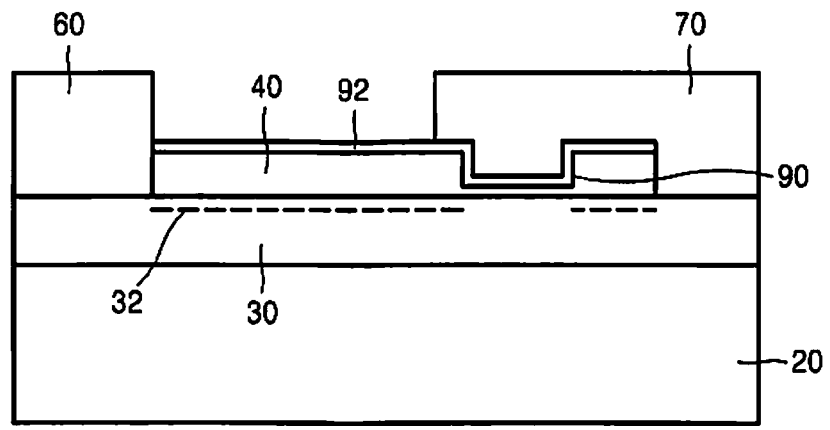
Figure 4B:
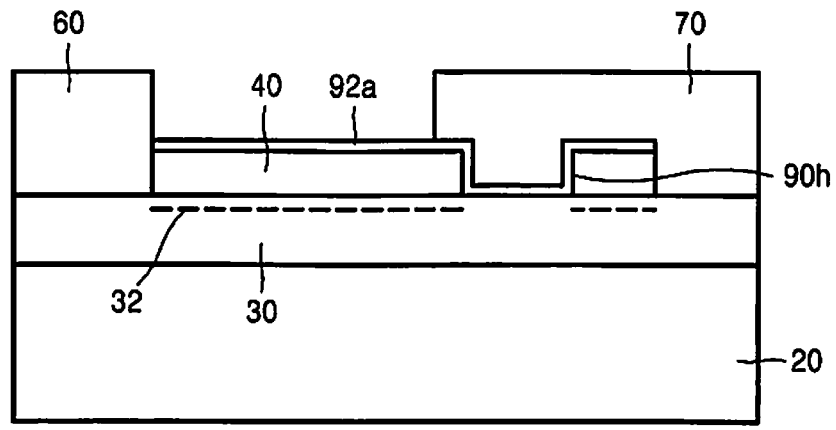
Figure 5:
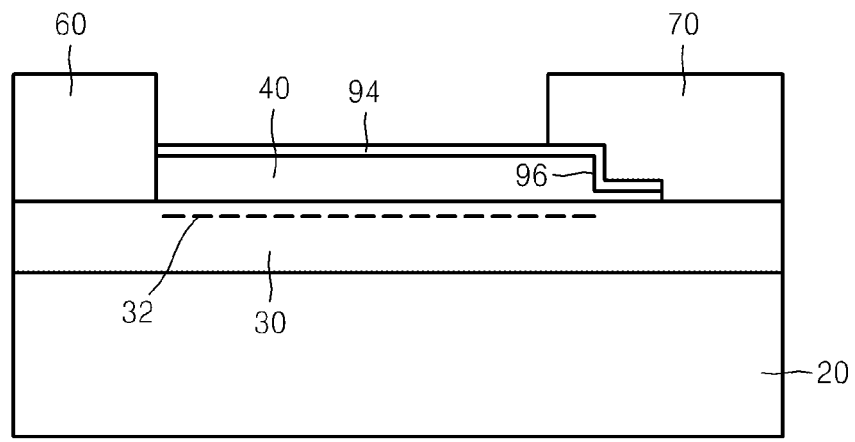

FIGS. 3 through 5 show additional embodiments of a switching device which may represent modifications of the switching device shown in FIG. 2. Therefore, only differences between the embodiment shown in FIG. 2 and the embodiments shown in FIGS. 3 through 5 will be described below.

First, referring to FIG. 3, the top surface of the portion of the channel supply layer 40 around the P-GaN layers 50 is covered with an insulation layer 80. The P-GaN layers 50 are also covered with the insulation layer 80. The insulation layer 80 may be formed of silicon oxide, silicon nitride, or aluminum oxide.

Next, referring to FIG. 4A, a recess 90 is formed at the location corresponding to the P-GaN layers 50 in FIG. 3, instead of the P-GaN layers 50. Since the recess 90 is formed at the channel supply layer 40, a thickness of the portion of the channel supply layer 40 below the recess 90 may be significantly smaller than thickness of the remaining portion of the channel supply layer 40. Therefore, a difference between polarizability of the channel supply layer 40 and polarizability of the channel forming layer 30 below the recess 90 is significantly smaller than elsewhere or little.

Also, similar to the case in which the P-GaN layers 50 is arranged, the density of the 2DEG 32 below the recess 90 may be low or lower or the 2DEG 32 may not exist below the recess 90. Therefore, the portion of the channel forming layer 30 right below the recess 90 may become a depletion area. The recess 90 may be completely covered by the anode 70, and an insulation layer 92 may be arranged between the anode 70 and the recess 90. The insulation layer 92 may cover the recess 90 and all or a portion of the top surface of the channel supply layer 40. The insulation layer 92 may or may not be identical to the insulation layer 80 of FIG. 3.

Meanwhile, as shown in FIG. 4B, a hole 90h penetrating into or through the channel supply layer 40 may be formed at the location corresponding to the recess 90 in FIG. 4(a). Here, there is no 2DEG below the hole 90h. The inner surface of the hole 90h and a portion of the channel forming layer 30 exposed by the hole 90h may be covered with an insulation layer 92a. Here, the top surface of the channel supply layer 40 may also be covered with the insulation layer 92a. The insulation layer 92a may be formed of the same material as the insulation layer 92 of FIG. 4(a) or may be formed of a different material.

Referring to FIG. 5, a recess 96 is arranged at an end of the channel supply layer 40 contacting the anode 70. The recess 96 is a recess opened toward the anode 70. Surfaces of the recess 96 are covered with an insulation layer 94. The insulation layer 94 may extend to cover the entire top surface of the channel supply layer 40; however, in other embodiments insulation layer 94 may cover less than the entire top surface of the channel supply layer 40. The anode 70 covers the recess 96 covered with the insulation layer 94. The insulation layer 94 may or may not be identical to the insulation layer 92 of FIG. 4.

Figure 6:
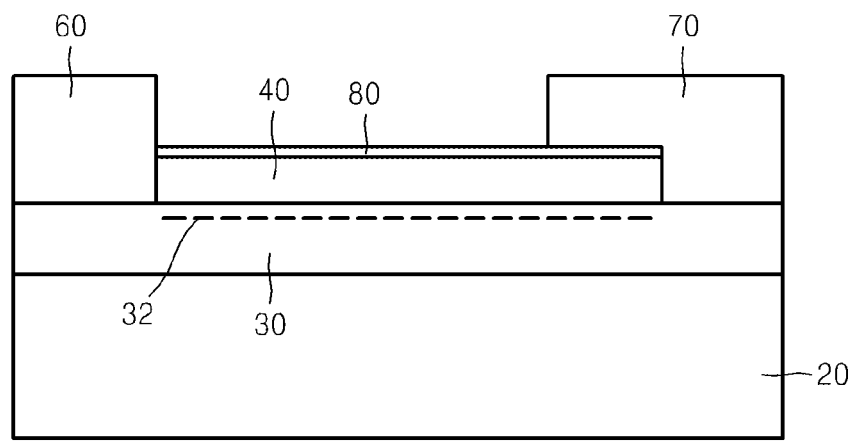
FIG. 6 is a sectional view, taken along a line 6-6' of FIG. 1.

FIG. 6 is a sectional view, taken along a line 6-6' of FIG. 1; that is, a line between the P-GaN layers 50. Referring to FIG. 6, the channel forming layer 30 and the channel supply layer 40 are stacked in the order previously stated, and the top surface of the channel supply layer 40 may be covered with the insulation layer 80. However, in an alternative embodiment, like the case where the P-GaN layers 50 directly contact the anode 70 as shown in FIG. 2, the insulation layer 80 may be omitted in FIG. 6.

The 2DEG 32 exists in the portion of the channel forming layer 30 below the channel supply layer 40. However, in FIG. 6, there is no depletion area below the channel supply layer 40. In other words, area below the channel supply layer 40 is a non-depletion area.

Considering that FIG. 6 is a sectional view taken along a line 6-6' of FIG. 1 and FIGS. 2 through 5 are sectional views taken along a line across the P-GaN layers 50 of FIG. 1, it is therefore evident that depletion areas and non-depletion areas are periodically or alternately arranged below the channel supply layer 40 as the P-GaN layers 50 (or the recesses 90) are periodically or alternately formed. The pattern of the P-GaN layers may therefore determine the pattern of the depletion and non-depletion areas below channel supply layer 40. This pattern may be a stripe, spaced, interval, or another pattern according to one or more embodiments.

Since the 2DEG 32 exists in the non-depletion area, when a forward voltage lower than a threshold voltage is applied, a current does not flow in the depletion area. However, a current lower than a rated current may flow in the non-depletion area. Accordingly, a forward turn-on voltage of a power switching device according to an embodiment, at which a current begins to flow, may be lowered. Furthermore, if a voltage equal to or greater than the threshold voltage is applied, a current flows also in the depletion area, and thus a rated current may be obtained. Therefore, a power switching device according to one embodiment may obtain a rated current at a normal driving voltage.

Figure 7:
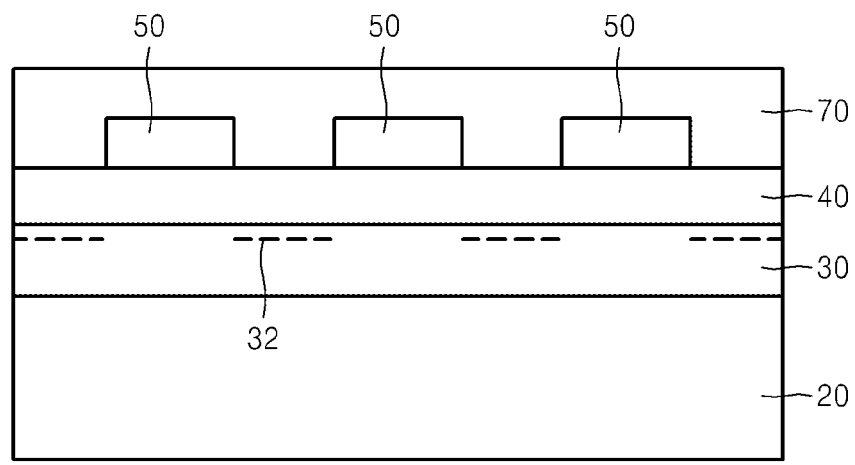
FIG. 7 is a sectional view, taken along a line 7-7' of FIG. 1.

FIG. 7 is a sectional view taken along a line 7-7' of FIG. 1. For convenience of illustration, only three of the plurality of P-GaN layers 50 constituting a stripe pattern are shown.

Referring to FIG. 7, the three P-GaN layers 50 are formed on the channel supply layer 40. The 2DEG 32 does not exist in the portion of the channel forming layer 30 right below the P-GaN layers 50. The 2DEG 32 exists in the portion of the channel forming layer 30 between the P-GaN layers 50. Therefore, the portion of the channel forming layer 30 right below the P-GaN layers 50 becomes a depletion area, whereas the portion of the channel forming layer 30 between the P-GaN layers 50 become a non-depletion area. The anode 70 covering the P-GaN layers 50 is arranged on the channel supply layer 40.

Figure 8:
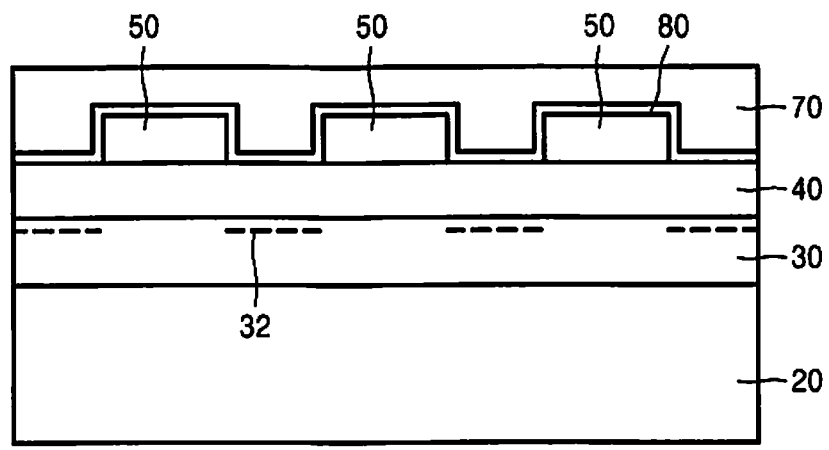
FIGS. 8 through 10 show modifications of FIG. 7.

FIG. 8 is a sectional view showing a modification of the embodiment shown in FIG. 7. Referring to FIG. 8, the channel supply layer 40 and the P-GaN layers 50 are covered with the insulation layer 80. The anode 70 is formed on the insulation layer 80.

Figure 9:
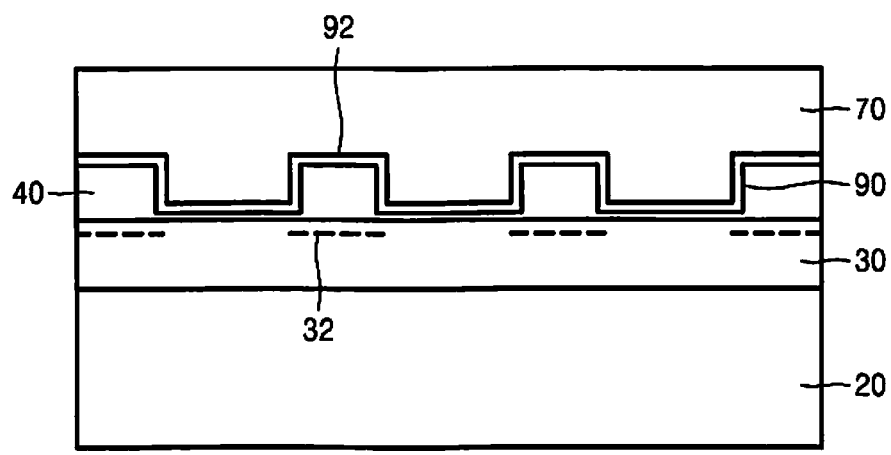

FIG. 9 is a sectional view showing another modification of the embodiment shown in FIG. 7. Referring to FIG. 7, a plurality of recesses 90 that are separated from one another are formed at the channel supply layer 40. Locations of the recesses 90 may correspond to locations of the P-GaN layers 50 in FIG. 8.

The recesses 90 may have a same width or different widths. Furthermore, the recesses 90 may be apart from each other by a constant distance or varying distances. Surfaces of the recesses 90 and the top surface of the channel supply layer 40 are covered with the insulation layer 92. The anode 70 covering the recesses 90 and the top surface of the channel supply layer 40 is formed on the insulation layer 92.

Figure 10:
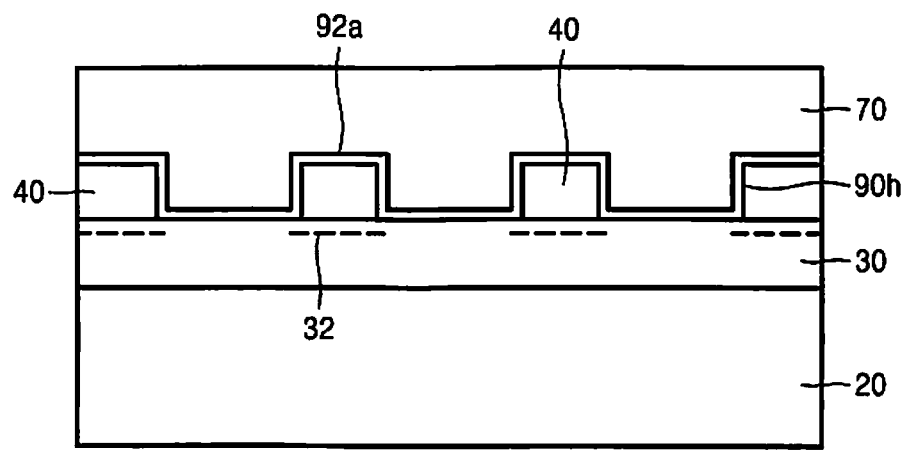

FIG. 10 is a sectional view showing another modification of the embodiment shown in FIG. 7. Referring to FIG. 10, the channel supply layer 40 includes a plurality of holes 90h. Locations of the holes 90h may be identical to those of the recesses 90 of FIG. 9. Portions of the channel forming layer 30 are exposed by the holes 90h. Inner surfaces of the holes 90h, the portions of the channel forming layer 30 exposed by the holes 90h, and the top surface of the channel supply layer 40 are covered with the insulation layer 92a. The anode 70 is arranged on the insulation layer 92. The anode 70 fills the holes 90h that are covered with the insulation layer 92a and covers the channel supply layer 40 covered with the insulation layer 92a.

Figure 11:
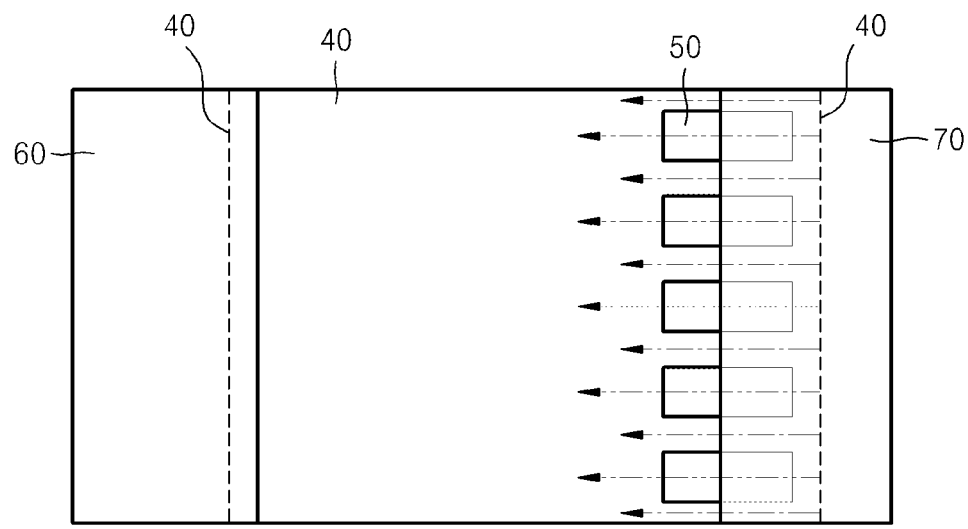
FIG. 11 is a plan view showing flow of a current in an embodiment of a power switching device when a forward voltage is applied.

FIG. 11 is a plan view showing flow of a current in a power switching device according to an example embodiment when a forward voltage Va is applied. Referring to FIG. 11, if the voltage Va applied in the forward direction is greater than a first threshold voltage (e.g., 0V), a first current (alternated long and short dash line) flows in the non-depletion area between the P-GaN layers 50.

Next, as the forward voltage Va rises to a second threshold voltage greater than the first threshold voltage (e.g., from 0.5V to 1V), a second current (two point chain line) flows in the depletion area below the P-GaN layers 50. Shortly thereafter, the forward voltage Va exceeds the second threshold voltage, a current flows throughout the channel forming layer 30 and reaches to a rated current.

As described above, the first current is generated as the voltage applied in the forward direction exceeds the first threshold voltage, turn-on voltage of a power switching device according to one embodiment may be lowered. In other words, the ON resistance of the power switching device may be reduced. Furthermore, since a rated current may be obtained as the voltage applied in the forward direction exceeds the threshold voltage, a period of time elapsed for a power switching device to be normally operated may be reduced.

Figure 12:
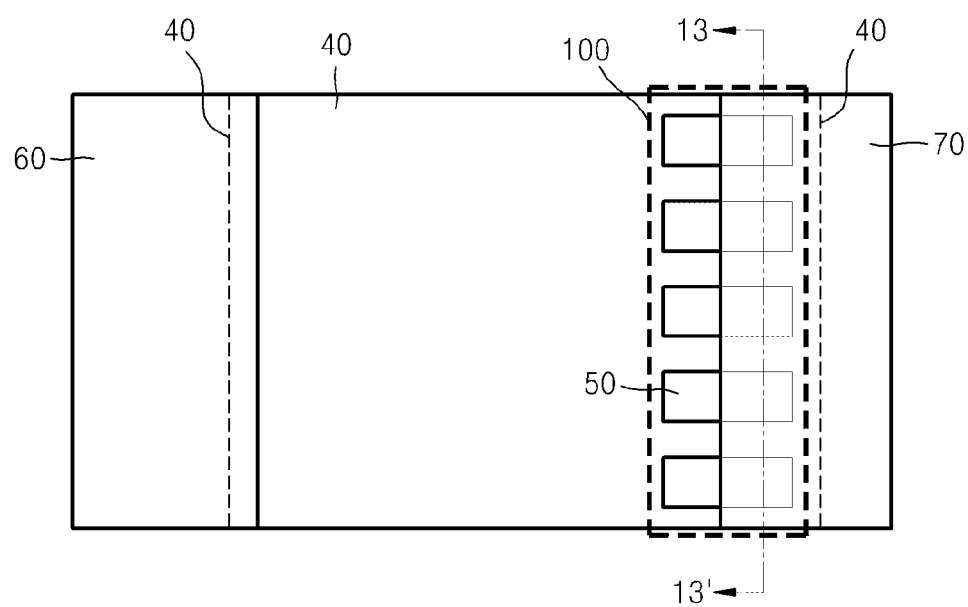
FIG. 12 is a plan view showing an example of expansion of a depletion area of a channel forming layer when a reverse voltage is applied to a power switching device.

FIG. 12 is a plan view showing expansion of depletion area of the channel forming layer 30 when a reverse voltage is applied to a power switching device according to an embodiment. Referring FIGS. 8 and 12, when a reverse voltage is applied to a power switching device, the 2DEG (32 of FIG. 8) in an area (non-depletion area) of the channel forming layer 30 between the P-GaN layers 50 is eliminated. Therefore, the depletion area below the P-GaN layers 50 expand to the non-depletion area between the P-GaN layers 50, and thus the entire area 100 of the channel forming layer 30 on which the P-GaN layers 50 are formed becomes a depletion area.

Figure 13:
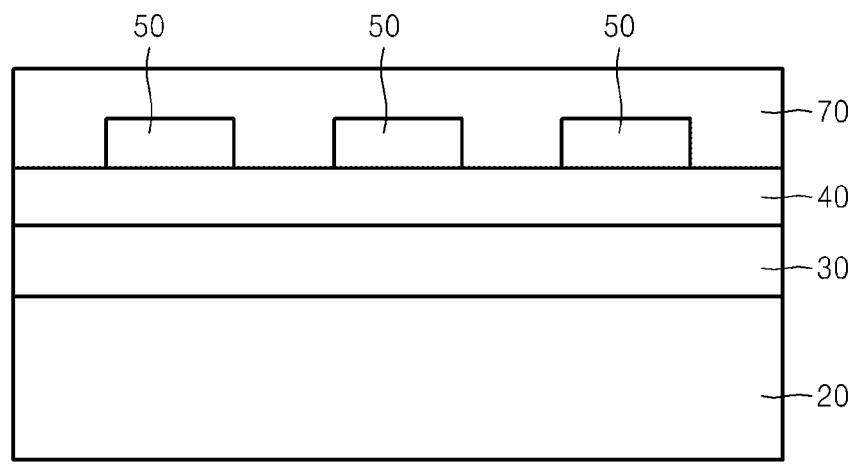
FIG. 13 is a sectional view, taken along a line 13-13' of FIG. 12.

FIG. 13 is a sectional view taken along a line 13-13' of FIG. 12. Referring to FIG. 13, there is no 2DEG in an area of the channel forming layer 30 between the P-GaN layers 50. Since the depletion area expands as a voltage is applied in the reverse direction, an increase of a leakage current due to application of a reverse voltage may be prevented.

Figure 14:
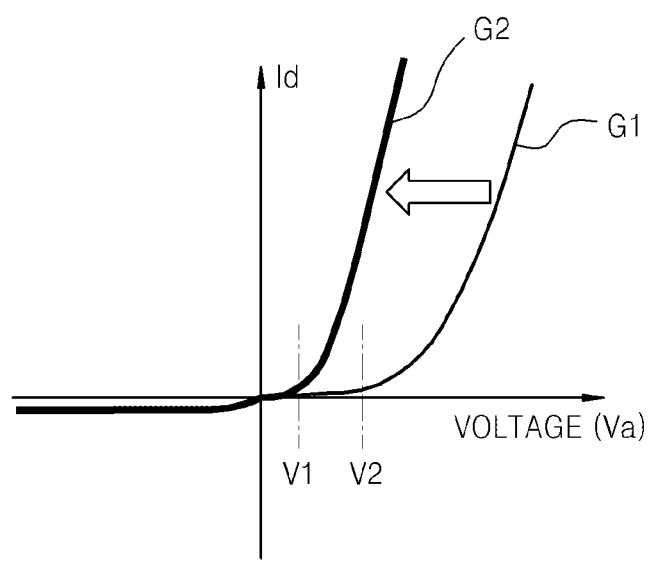
FIG. 14 is a graph showing current-voltage characteristics of an embodiment of a power switching device.

FIG. 14 is a graph showing current-voltage characteristics of a power switching device according to an example embodiment. In FIG. 14, a first graph G1 is a graph showing current-voltage characteristics of one type of a power switching device which does not include P-GaN layers 50 at all or arranged in a stripe pattern, and a second graph G1 is a graph showing current-voltage characteristics of an embodiment of the power switching device which includes the P-GaN layers 50 in the stripe pattern.

Comparing the first and second graphs G1 and G2 of FIG. 14, when a forward voltage Va is applied, the turn-on voltage on the first graph G1 is a second voltage V2, whereas the turn-on voltage on the second graph G2 is a first voltage V1 that is lower than the second voltage V2. As a result, the graph G2 showing current-voltage characteristics of the example embodiment of the power switching device is very similar to the current-voltage characteristics of the power switching device corresponding to graph G1.

Next, an embodiment of a method of manufacturing a power switching device (e.g., a power diode) will be described with reference to FIGS. 15 through 19. Like reference numerals denote like elements, and thus detailed descriptions thereof will be omitted.

Figure 15:
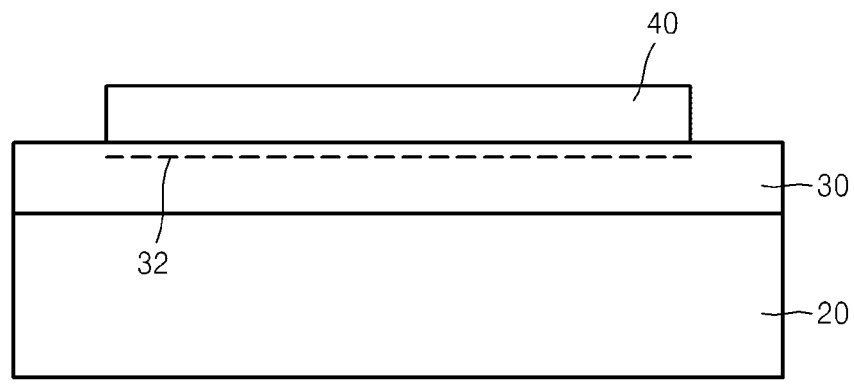
FIGS. 15 through 19 are sectional views showing an embodiment of a method of manufacturing a power switching device.

Referring to FIG. 15, the channel forming layer 30 is formed on a substrate 20. The channel forming layer 30 may be formed of a Group III-V compound semiconductor, e.g., GaN. The channel forming layer 30 may also be formed of any of various other compound semiconductors. The channel supply layer 40 is formed on the channel forming layer 30. The channel supply layer 40 may be formed of a compound semiconductor layer having a polarizability or a different band gap greater than that of the channel forming layer 30. For example, the channel supply layer 40 may be formed of AlGaN.

A material constituting the channel supply layer 40 may vary according to a material constituting the channel forming layer 30. For example, if the channel forming layer 30 is formed of GaAs, the channel supply layer 40 may be formed of AlGaAs. As described above, the channel forming layer 30 and the channel supply layer 40 may be formed of GaN-based compound semiconductors.

However, the channel forming layer 30 and the channel supply layer 40 may also be formed of other compound semiconductors, e.g., compound semiconductors containing no nitrogen (N). As the channel supply layer 40 is formed, the 2DEG 32 appears at the channel forming layer 30 due to a difference between polarizability of the channel supply layer 40 and polarizability of the channel forming layer 30. The 2DEG 32 is located below the top surface of the channel forming layer 30, where the top surface of the channel forming layer 30 contacts the channel supply layer 40.

Figure 16:
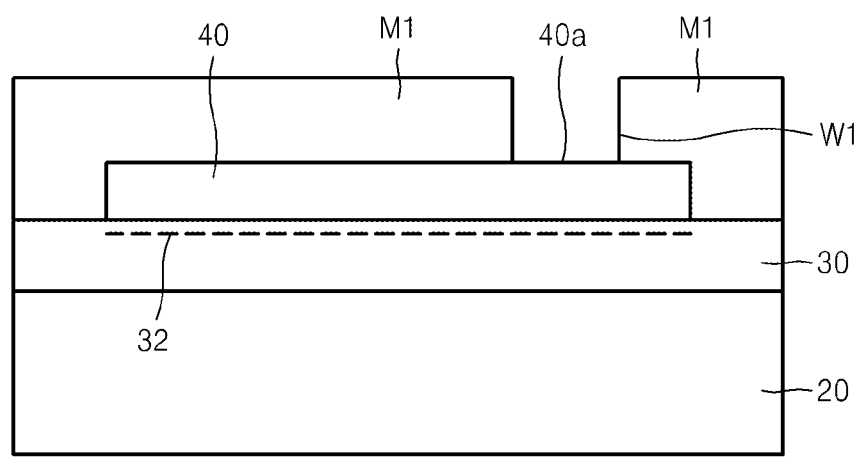

Referring to FIG. 16, a mask M1 covering the channel supply layer 40 is formed on the channel forming layer 30. The mask M1 may be a photosensitive film pattern. After the mask M1 is formed, a window W1 for exposing a portion 40a of the channel supply layer 40 is formed by partially removing the mask M1.

Figure 17:
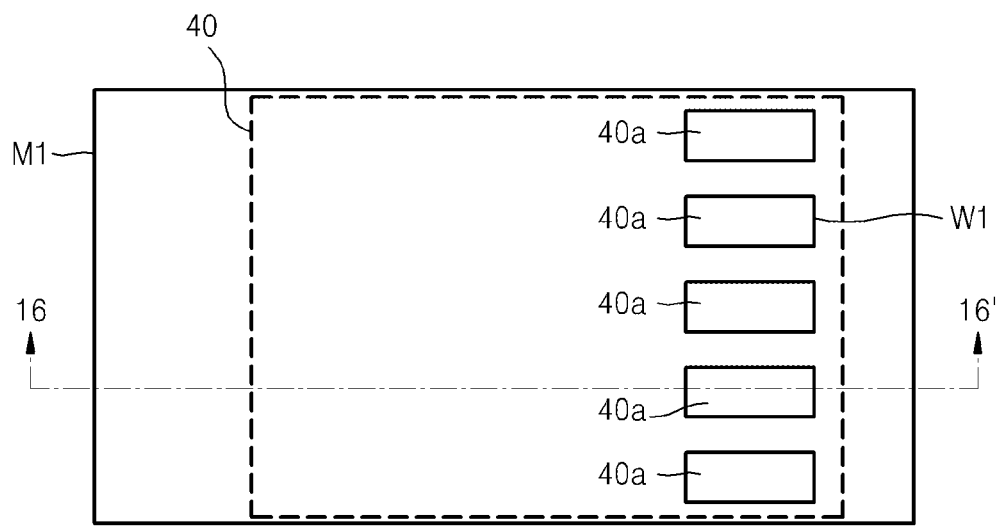

FIG. 17 is a plan view of the structure shown in FIG. 16. Referring to FIG. 17, a plurality of windows W1 are formed in the mask M1. The plurality of windows W1 are apart from one another and are arranged in a stripe pattern. The P-GaN layers 50 are formed on portions of the channel supply layer 40 that are exposed by the windows W1 of the mask M1.

Figure 18:
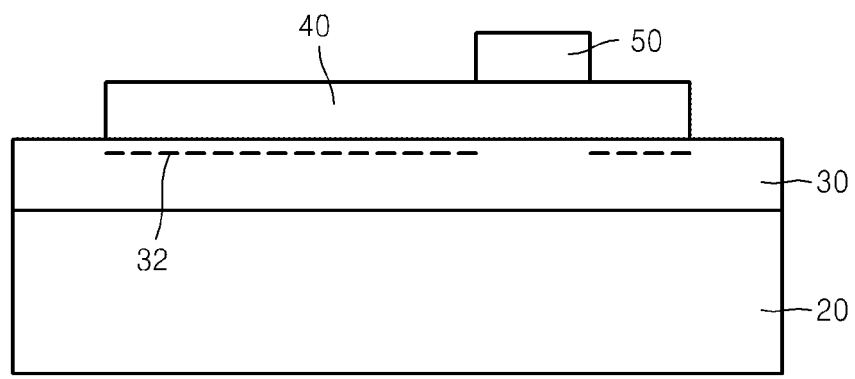

Here, although P-GaN layers are also deposited on the mask M1, the P-GaN layers deposited on the mask M1 are not shown for convenience of explanation. Next, the mask M1 is removed. The P-GaN layers formed on the mask M1 are removed together with the mask M1. In other words, the P-GaN layers formed on the mask M1 may be lifted off. As a result, the P-GaN layers 50 are formed on a portion of the top surface of the channel supply layer 40 as shown in FIG. 18.

As the P-GaN layers 50 are formed on a portion of the channel supply layer 40, the 2DEG below the P-GaN layers 50 is thinned or eliminated. In other words, as the P-GaN layers 50 are formed, the portion of the channel forming layer 40 below the P-GaN layers 50 becomes depletion area.

Figure 19:
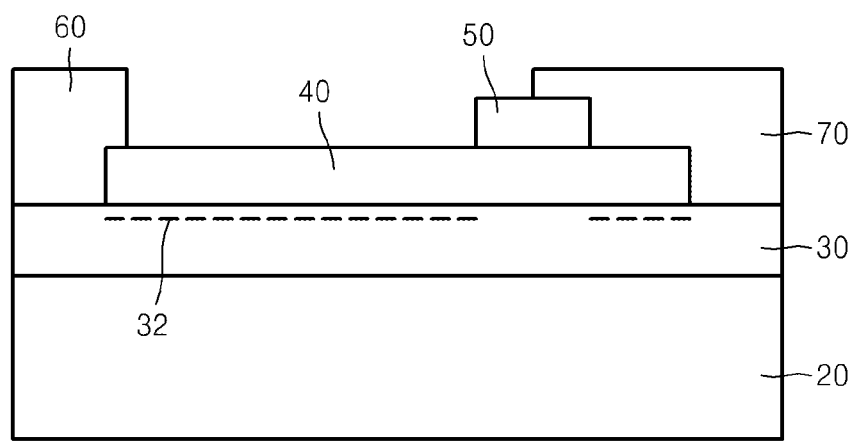

Next, referring to FIG. 19, the cathode 60 and the anode 70 contacting the channel supply layer 40 are formed on the channel forming layer 30. The cathode 60 and the anode 70 may be simultaneously formed. The cathode 60 contacts a first end of the channel supply layer 40, whereas the anode 70 is formed on another side of the channel supply layer 40. The cathode 60 may be formed to partially overlap the channel supply layer 40. Furthermore, the anode 70 may also be formed to partially overlap the channel supply layer 40. The anode 70 may be formed to contact and overlap the P-GaN layers 50.

Accordingly, a power switching device, in which depletion area is formed by using the P-GaN layers 50, that is, a power diode is formed.

Meanwhile, the P-GaN layers 50 may be formed by using a lift-off method using the mask M1 as described above with reference to FIGS. 16 through 18 or may be formed by using another method. For example, after a P-GaN material layer is formed on the channel supply layer 40, a mask for defining an area in which the P-GaN layers 50 are to be formed may be formed on the P-GaN material layer. Next, the P-GaN layers 50 may be formed by etching the P-GaN material layer by using the mask and removing the mask.

Meanwhile, during the formation of the P-GaN layers 50, the recess 90 as shown in FIG. 4 may be formed in the portion 40a of the channel supply layer 40 exposed by the window W1 as shown in FIGS. 16 and 17, instead of forming the P-GaN layers 50 thereon. In this case, the mask M1 is an etching mask for forming the recess 90.

During the formation of the recess 90, the holes 90h by which the channel forming layer 30 is exposed may be formed instead of the recess 90, as shown in FIG. 4(b). After the P-GaN layers 50, the recess 90, or the holes 90h are formed, an insulation layer covering the P-GaN layers 50 (80 of FIG. 3), an insulation layer covering the recess 90 (90 of FIG. 4), and an insulation layer covering the inner surfaces of the holes 90h and surfaces exposed by the holes 90h (92a of FIG. 4) may also be formed.

As described above, according to the one or more embodiments, due to the configuration of a channel forming layer, a current flows by using 2DEG of the non-depletion area at a low voltage when a power switching device is driven in the forward direction, and when the driving voltage exceeds a threshold voltage, a current flows also in the depletion area. Therefore, turn-on voltage is low (e.g., almost 0V) and ON resistance is low.

Furthermore, when the power switching device is driven in the reverse direction, the depletion area expands to the non-depletion area, and thus a depletion area belt is formed in the channel forming layer between a cathode and an anode. As a result, the power switching device becomes a diode similar to a normally off field effect transistor (FET) and is capable of preventing increase of leakage current in the reverse direction.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor device comprising:
a first semiconductor layer over a substrate;
a second semiconductor layer over the first layer;
a two-dimensional electron gas adjacent an interface between the first and second semiconductor layers; and
a plurality of formations corresponding to the second semiconductor layer, the plurality of formations arranged in one dimensional array when viewed from the plan view, the plurality of formations including at least three formations,
the first semiconductor layer including a plurality of first areas aligned with the plurality of formations and a second area adjacent the plurality of first areas, each of the plurality of first areas being a depletion region of the two-dimensional electron gas and the second area being a non-depletion area of the two-dimensional electron gas.

2. The semiconductor device of claim 1, further comprising:
a first electrode coupled the first and second semiconductor layers; and
a second electrode coupled to the first and second semiconductor layers at a location different from the first electrode.

3. The semiconductor layer of claim 2, wherein the second semiconductor layer is between the first and second electrodes.

4. The semiconductor layer of claim 1, wherein a density of the two-dimensional electron gas at the depletion region is substantially zero.

5. The semiconductor device of claim 1, wherein each of the plurality of formations includes a semiconductor section over the second semiconductor layer.

6. The semiconductor device of claim 5, wherein the semiconductor section includes GaN doped with a p-type impurity.

7. The semiconductor device of claim 1, wherein the plurality of formations includes a plurality of spaced semiconductor sections over the second semiconductor layer.

8. The semiconductor device of claim 7, wherein the first semiconductor layer includes a plurality of first areas corresponding to respective ones of the plurality of semiconductor sections and the second area corresponding to an area between the plurality of semiconductor sections.

9. The semiconductor device of claim 1, wherein
each of the plurality of formations includes a recess in the second semiconductor layer, the first semiconductor layer having a first thickness in the plurality of first areas corresponding to the recess and a second thickness greater than the first thickness corresponding to the second area.

10. The semiconductor device of claim 1, further comprising:
an insulation layer over the second semiconductor layer and the plurality of formations.

11. The semiconductor device of claim 1, wherein each of the plurality of first areas and the second area have different widths.

* * * * *